United States Patent [19]

Aboaf et al.

[11] Patent Number: 4,476,454

[45] Date of Patent: Oct. 9, 1984

[54] NEW MAGNETORESISTIVE MATERIALS

[75] Inventors: Joseph A. Aboaf, Tucson, Ariz.; Erik Klokholm, Stamford, Conn.; Thomas R. McGuire, Yorktown Heights, N.Y.

[73] Assignee: International Business Machines Corporation, Armonk, N.Y.

[21] Appl. No.: 509,739

[22] Filed: Jun. 30, 1983

[51] Int. Cl.³ .................. H01L 43/08; H01L 43/10
[52] U.S. Cl. ......................... 338/32 R; 360/113; 324/252; 365/158
[58] Field of Search .............. 338/32 R; 360/113; 324/252; 365/158

[56] References Cited

U.S. PATENT DOCUMENTS

| 3,691,540 | 9/1972 | Almasi et al. | 340/174 |
|---|---|---|---|
| 3,848,217 | 11/1974 | Lazzari | 338/32 R |
| 4,212,688 | 7/1980 | Makino et al. | 148/31.55 |
| 4,242,710 | 12/1980 | Hempstead et al. | 360/113 |
| 4,280,158 | 7/1981 | de Niet | 360/113 |
| 4,296,377 | 10/1981 | Ohkubo | 324/252 |
| 4,321,640 | 3/1982 | van Gestel | 360/113 |

OTHER PUBLICATIONS

E. N. Mitchel et al., J. Appl. Phys., vol. 35, pp. 2604–2608, Sep. 1964.

H. C. vanElst, "The Anisotropy in the Magneto-Resistance of Some Nickel Alloys", Physica 25, p. 708, 1959.
L. J. vanderPauw, Philips Research Reports, vol. 13, No. 1, pp. 1–9, Feb. 1958.
McGuire et al., IEEE Transactions on Magnetics, vol. Mag-11, No. 4, p. 1018, Jul. 1975.
E. Klokholm et al., J. Appl. Phys. 52, 3, p. 2474, Mar. 1981.

*Primary Examiner*—C. L. Albritton
*Assistant Examiner*—C. N. Sears
*Attorney, Agent, or Firm*—Jackson E. Stanland

[57] ABSTRACT

Devices and circuits are described employing magnetoresistive materials exhibiting a negative $\Delta\rho$ effect ($\Delta\rho = \rho\| - \rho\bot$). In these materials, the electrical resistivity $\rho$ of the material in a direction perpendicular to the direction of current through the material is greater than the electrical resistivity $\rho\|$ of the material in a direction parallel to the direction of the electrical current through the material. These are ferromagnetic materials exhibiting magnetoresistance in the presence of an electrical current through the material and a magnetic field applied to the material to magnetize it to saturation at room temperature. These devices and circuits have advantages over conventional devices and circuits employing magnetoresistive materials of the conventional type, in which $\Delta\rho$ is a positive quantity.

17 Claims, 9 Drawing Figures

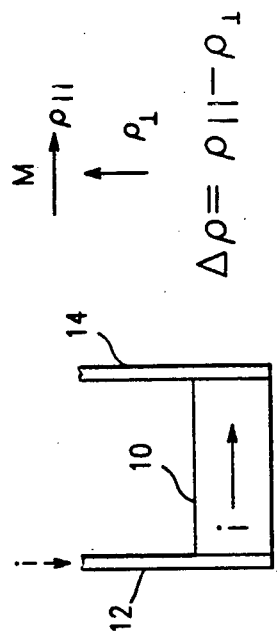
FIG. 1
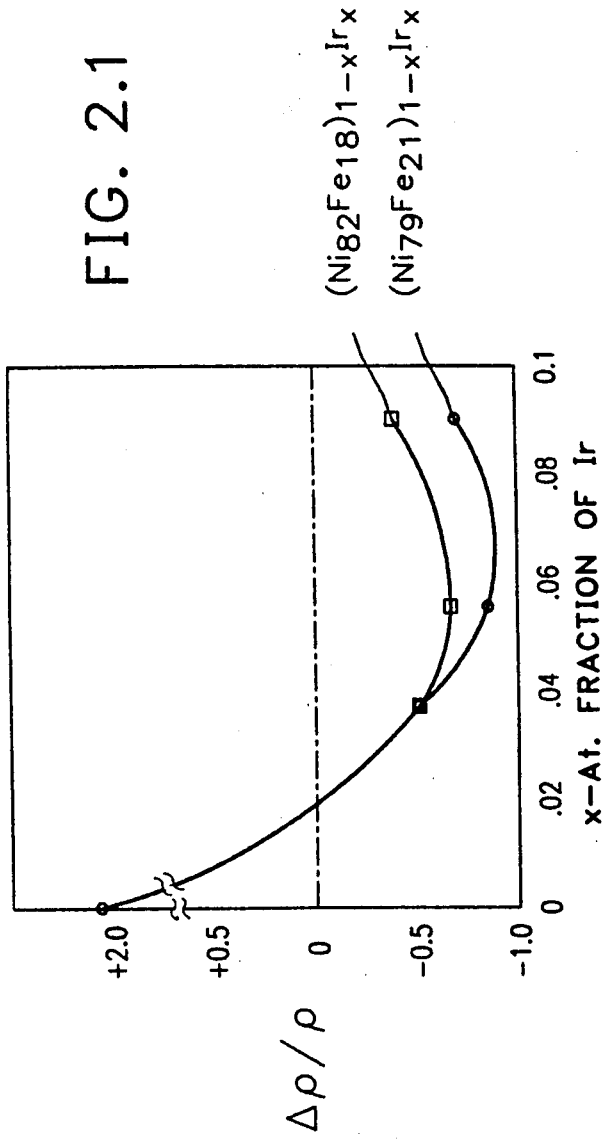
FIG. 2.1

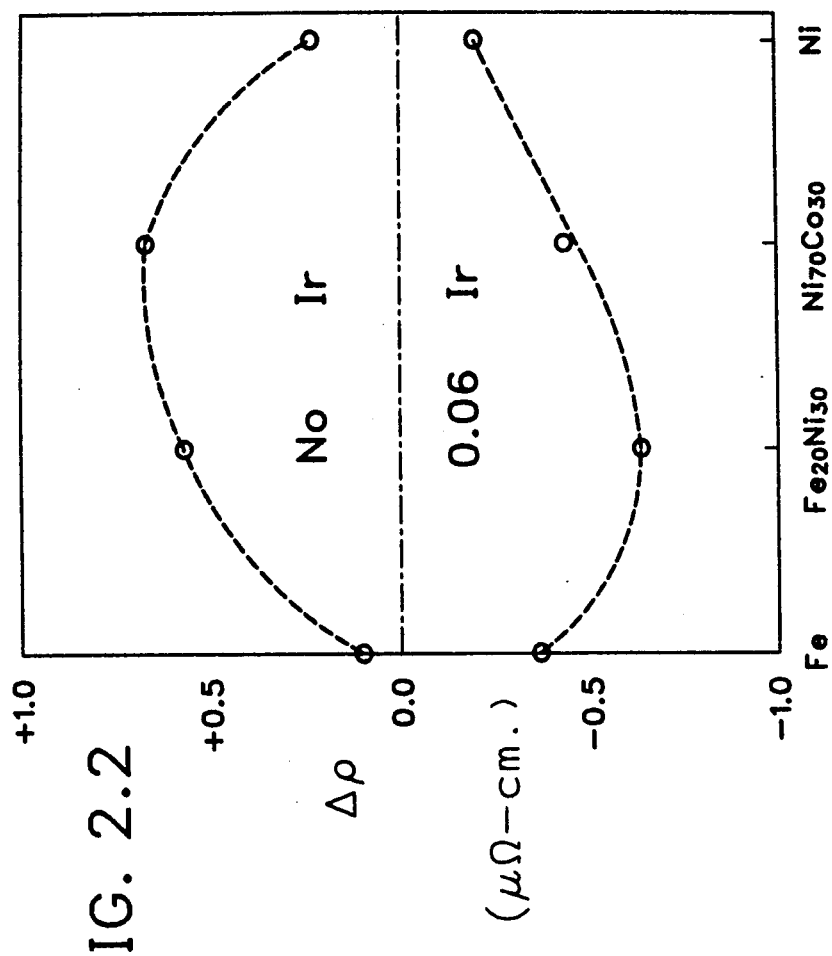
FIG. 2.2

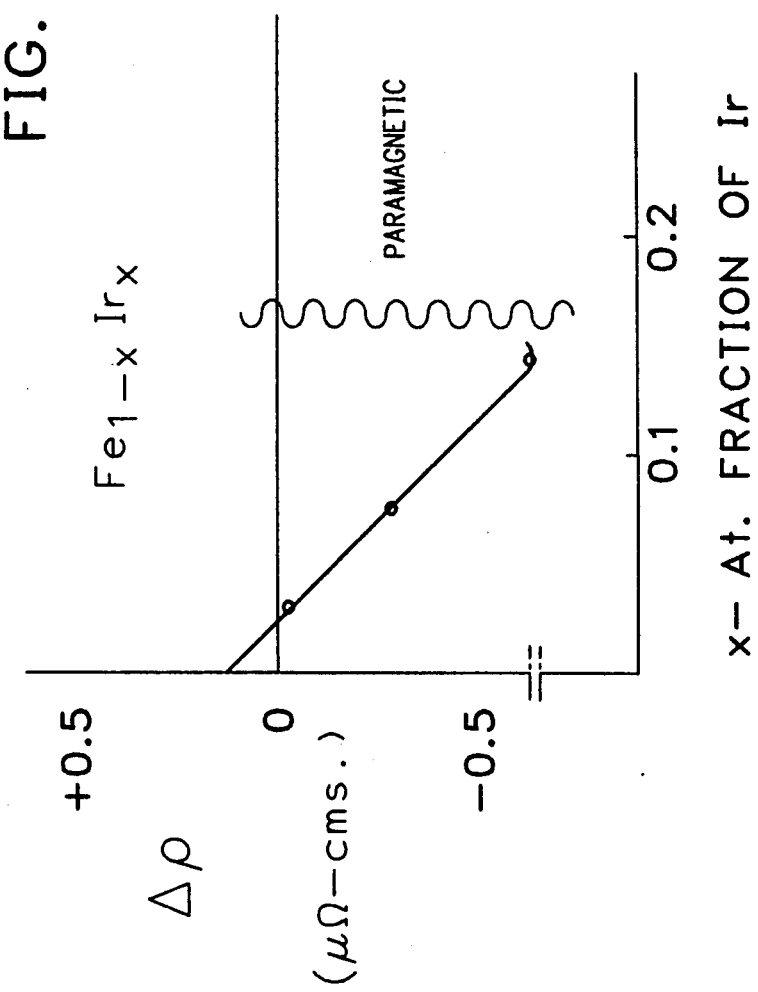
FIG. 2.3

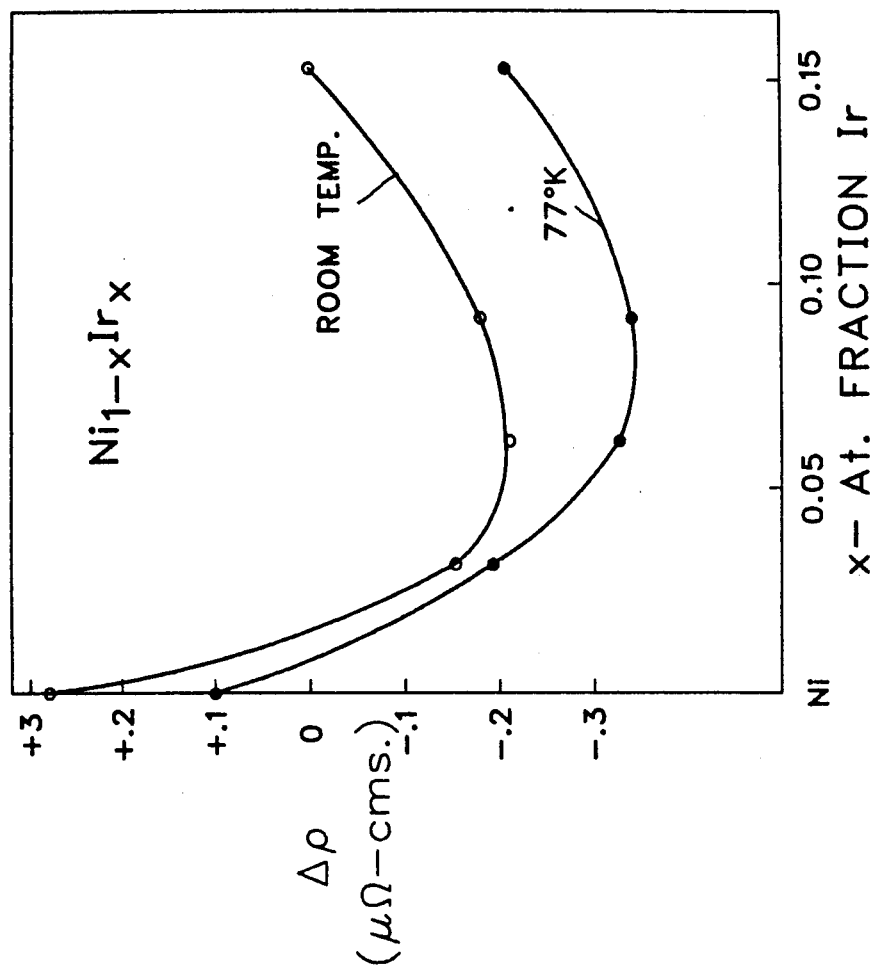
FIG. 2.4

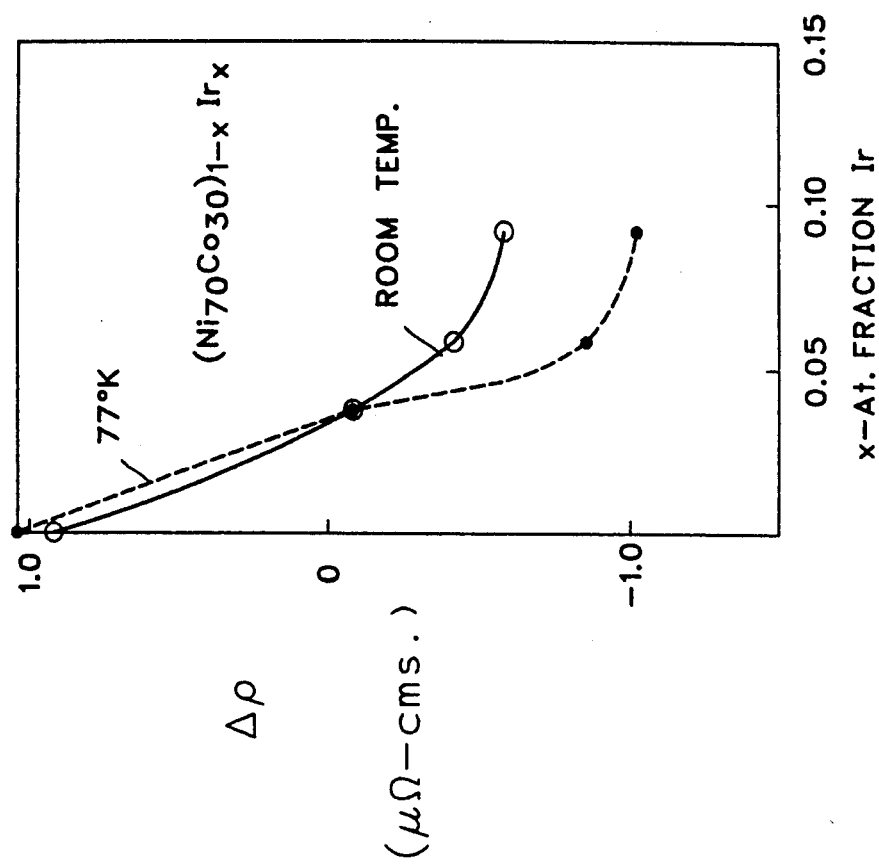
FIG. 2.5

NEW MAGNETORESISTIVE MATERIALS

DESCRIPTION

1. Technical Field

This invention relates to the use of magnetoresistive materials, and more particularly to the use of a new class of such materials in which, in the presence of an electrical current through the material and a uniform magnetic field applied to the material to uniformly magnetize it to saturation at room temperature, the electrical resistivity of the material in a direction perpendicular to the direction of current is greater than the electrical resistivity of the material in a direction parallel to the direction of electrical current.

2. Background Art

In ferro-magnetic metals and alloys, the electrical resistivity $\rho$ depends on the direction of electrical current through the material with respect to the direction of the saturated magnetization M in the material. When the current and the magnetization are parallel ($\|$), a resistivity $\rho\|$ is measured. When the electrical current and the magnetization M are to each other ($\perp$), a resistivity $\rho\perp$ is measured. For these measurements, it is assumed that a uniform magnetic field H is applied to the material having a sufficient strength to uniformly magnetize the material to saturation at a particular temperature T.

The resistivities $\rho\|$ and $\rho\perp$ differ slightly in magnitudes, and at room temperature it has been found that $\rho\|$ is greater than $\rho\perp$. This difference in resistivity is the basis for many practical devices using magnetoresistive materials. For example, magnetoresistive sensors and field detectors are known in the art in which a sample of magnetoresistive material is used to detect the presence of a magnetic field, such as the magnetic field emanating from a magnetic domain in a tape, disk or a magnetic bubble domain medium. The stray magnetic field of the domain intercepts the magnetoresistive sample and causes its magnetization vector to rotate. In turn, this produces a change in the electrical resistivity of the material, which is used as an indication of the presence or absence of the stray magnetic field. For example, U.S. Pat. No. 3,691,540 describes a magnetoresistive sensor for the detection of magnetic bubble domains. When a magnetic bubble domain is in magnetic-flux coupling proximity to the magnetoresistive (MR) sensor, the magnetization vector in the sensor will rotate and the electrical resistivity of the sensor will change. That patent describes different features of MR sensors and discusses them in terms of the anisotropy field $H_k$, the demagnetizing field along a hard axis of the sensor, and the thickness of the sensor. The general description of magnetoresistive materials and their design found in that patent are incorporated herein by reference.

The art is repleat with many references describing magnetoresistive properties, the following of which are only three such references:

E. N. Mitchell et al, J. App. Phys., Vol. 35, pages 2604–2608, September 1964

H. C. Van Elst "The Anisotropy in the Magneto-Resistance of Some Nickel Alloys", Physica 25, page 708, 1959

L. J. van der Pauw, Philips Research Reports, Vol. 13, No. 1, pages 1–9, February 1958.

In the history of the art dealing with magnetoresistance, it has always been found that $\rho\|$ is greater than $\rho\perp$ at room temperatures. Thus, the quantity $\Delta\rho$, called the anisotropic magnetoresistance and which is equal to $\rho\| - \rho\perp$, is a positive quantity. The only known exception to this is the extremely small effect noted by Van Elst for 93.75 Ni-6.25 Cr in the table on p. 712 of that reference. However, this extremely small amount may have been the result of noise, and not an accurate measurement. More recent measurements of the Ni—Cr system have not exhibited negative $\Delta\rho$. Apart from this possible discrepancy in data, it is clear that, even if $\Delta\rho$ is negative for some amount of Cr in Ni, the magnitude of $-\Delta\rho$ is very, very small.

Van Elst did report on a few materials exhibitioning $-\Delta\rho$ at very low temperatures where the "normal" effect of the electrical resistance of a metal in a magnetic field became important and dominated the typical ferromagnetic effect. Reference is made to J. Smit, Physica 16, page 612 (1951), Thesis Leiden (1956). On pages 714 and 715 some alloys having negative relative magnetoresistance anisotropy are described. Again, these are very low temperature effects. No reference is known describing a system in which negative anisotropic magnetoresistance is observed at room temperature, where the magnitude of $-\Delta\rho$ is appreciable.

The quantity $\Delta\rho$ can be divided by the average resistivity of the sample to give a quantity $\Delta\rho/\rho_{ave}$, which is called the anisotropic magnetoresistance ratio. In this ratio, $\rho_{ave}$ is given by $\frac{1}{3}\rho\| + \frac{2}{3}\rho\perp$. Values of $\Delta\rho$ range from 0 to 1 micro-ohm cm, in various alloy systems at all temperatures. If $\Delta\rho$ and $\rho$ are limited to room temperatures, the ratio $\Delta\rho/\rho$ can be as high as 3% or 4% in alloys of Ni—Fe and Ni—Co.

The causes of anisotropic magnetoresistance have been discussed in many reference papers including the Van Elst paper referenced above. In general, a spin-orbit interaction is invoked. Coupled with this interaction is a variation of the electrical resistance coming from spin-up and spin-down conduction electrons. The total scattering cross-section of the magnetic atom depends on the angle between the atom's electron spin and the momentum of the scattered conduction electrons. The basic mechansim of anisotropic magnetoresistance is complex and it is surprising that $\Delta\rho$ remains positive over a huge range of alloys of the type studied in the past 100 years. It is particularly surprising that no materials heretofore have been found which will provide negative $\Delta\rho$ of a substantial magnitude at room temperature.

It has been found that certain ferromagnetic materials can be made which exhibit negative $\Delta\rho$ at room temperatures, as well as at low temperatures. Further, these materials exhibit this effect strongly to provide a large magnitude of negative $\Delta\rho$. This magnitude can be as large as that of the conventional materials (i.e., $+\Delta\rho$ materials). Although some of these materials have been described previously for other reasons (such as corrosion resistant magnetic materials) by two of the present inventors (E. Klokholm and J. A. Aboaf, J. Appl. Phys., 52, 3, p. 2474, March 1981), the phenomenon of negative $\Delta\rho$ in these published materials was not described or in any way suggested in that paper, or elsewhere in the open literature.

In the practice of the present invention, it has been discovered that the addition of the element iridium (Ir) in a selected group of ferromagnetic host materials will provide magnetoresistive materials exhibiting negative $\Delta\rho$ at room temperatures and at low temperatures, and that the magnitude of this effect will be large. The host materials exhibiting ferromagnetism at room temperature include Ni, Fe, Co, and their ferromagnetic alloys and compounds. Ir in these host materials reacts strongly with the host lattice to alter the materials so that negative $\Delta\rho$ is present at room temperature. This is indeed a surprising effect in view of all the literature describing positive $\Delta\rho$ materials, and is also surprising in view of the fact that other elements closely located to Ir in the periodic table, such as rhodium (Rh) and platinum (Pt), do not work to produce the same effects in the same ferromagnetic host materials.

Becaue these materials have been found to exhibit negative $\Delta\rho$ at room temperature, and in a significant amount, new designs using these materials can be envisioned in those devices and circuits in which magnetoresistance is utilized. Such uses include magnetic field detectors and sensors of the type used to detect magnetic domains and magnetic domain transitions in recording media such as tapes, disks, etc.

Accordingly, it is a primary object of the present invention to provide devices which use a class of materials which exhibit negative $\Delta\rho$ at room temperature.

It is another object of the present invention to provide devices and circuits using magnetoresistive materials which exhibit negative $\Delta\rho$, both at room temperature and at low temperatures including cryogenic temperatures.

It is another object of the present invention to provide magnetoresistive materials including Ir and exhibiting negative $\Delta\rho$ which can be used in the design of many devices.

It is another object of the present invention to provide devices and circuits using magnetoresistive materials exhibiting a negative $\Delta\rho$, where the amount of negative $\Delta\rho$ can be as large as the amount of positive $\Delta\rho$ in $+\Delta\rho$ materials.

It is another object of the present invention to provide devices and circuits using magnetoresistive materials which can be made in thin film form and which exhibit negative $\Delta\rho$ at low temperatures and at room temperatures, and in which the negative $\Delta\rho$ does not depend in an important manner on the resistivity of the material, the thickness of the material, or the method of preparation of the material.

It is another object of the present invention to provide devices and circuits using magnetoresistive materials which are less sensitive to noise caused by temperature changes and other external effects.

It is another object of the present invention to provide devices and circuits using magnetoresistive materials having $-\Delta\rho$ which will exhibit increased outputs.

DISCLOSURE OF THE INVENTION

In its broadest sense, the present invention is directed to the use of ferromagnetic materials exhibiting negative $\Delta\rho$ at room temperature in devices and circuits in order to achieve advantages heretofore unknown. For example, magnetoresistive sensors can be fabricated using both a conventional magnetoresistive material and one of the magnetoresistive materials exhibiting negative $\Delta\rho$ at room temperature. Depending upon the arrangement of these two elements in the device, an amplified output signal can be obtained while at the same time cancelling effects of noise due to temperature changes and other external influences.

These negative $\Delta\rho$ materials are ferromagnetic materials including the element iridium (Ir). The ferromagnetic host materials in which Ir is present include Ni, Fe, and Co, as well as the room temperature ferromagnetic alloys and compounds of these materials. The minimum amount of Ir present in the magnetic material is an amount sufficient to cause negative $\Delta\rho$ at room temperature, while the maximum amount is that which would destroy magnetism in the material. Generally, the range of Ir present in the host material is approximately 1.5–15 atomic percent.

While the exact mechanism by which Ir produces negative $\Delta\rho$ is unknown at this time, it appears that Ir acts strongly with the host lattice of these materials in order to alter the magnetoresistive properties of the materials. As will be more apparent, a considerable amount of data has been measured showing the presence of the effect in a large amount, both at room temperature and at low temperatures.

These and other objects, features, and advantages will be apparent from the following more particular description of the preferred embodiments.

BRIEF DESCRIPTION OF THE DRAWINGS

FIG. 1 is a schematic representation of a magnetoresistive device in accordance with the present invention having a current i therethrough, which illustrates the direction of magnetization M in relation to the parallel and perpendicular resistivities $\rho\|$ and $\rho\perp$, respectively.

FIGS. 2.1–2.5 show various plots of the anisotropic magnetoresistance $\Delta\rho$ as a function of Ir content, for several magnetoresistive materials.

BEST MODE FOR CARRYING OUT THE INVENTION

Figure 4:
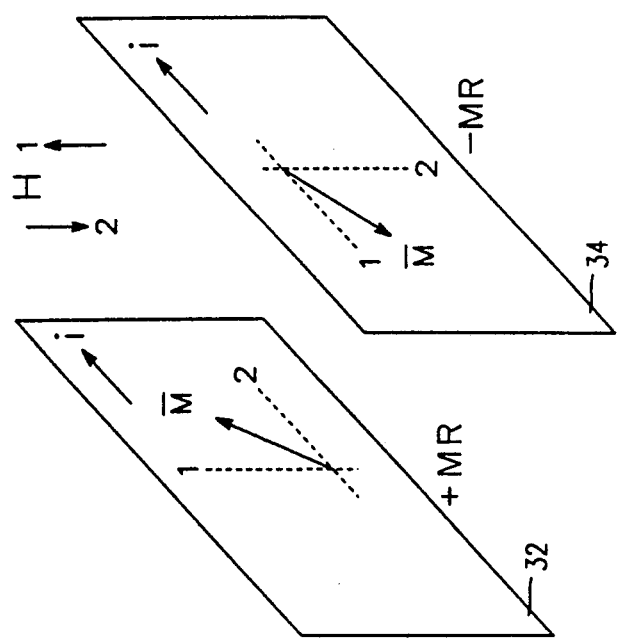
FIG. 4 shows a schematic arrangement of two magnetoresistive elements, one having positive $\Delta\rho$ and the other negative $\Delta\rho$, the two elements being part of a coupled magnetoresistive read head.

FIG. 1 shows a magnetic sample 10 to which is attached current carrying leads 12 and 14. Current i flows through lead 12 and along the length of MR element 10, returning by a conductor lead 14. The magnetization M of the magnetic element 10 is usually in the direction of the current i. In this case, the resistivity of magnetoresistive element 10 is given by $\rho\|$. When the magnetization M of element 10 is rotated to be perpendicular to the direction of current i, the measured resistivity is termed $\rho\perp$. Rotation of the magnetization vector can be caused by, for example, the application of a magnetic field to the element 10 in a direction perpendicular to the current flow through the element. The quantity $\Delta\rho=\rho\| -\rho\perp$ and is generally positive for conventional magnetoresistive materials.

In the practice of the present invention, magnetoresistive element 10 exhibits negative $\Delta\rho$ at room temperatures and at other temperatures, such as cryogenic temperatures. Magnetic element 10 is comprised of certain 3D transition metals which are ferromagnetic, and the alloys and compounds of these metals which are also ferromagnetic, together with Ir. The minimum amount of Ir in these ferromagnetic metals, alloys, and compounds is an amount sufficient to cause $\Delta\rho$ to be negative. For most of the materials mentioned, very small amounts of Ir are sufficient to cause $\Delta\rho$ to be negative. For example, atomic percentages of approximately 3.0 will produce this effect in Ni—Fe and Ni—Co alloys.

As will be more apparent later, the effect producing negative $\Delta\rho$ is a large effect, and causes a large negative $\Delta\rho$. Still further, this effect is one which is unique to Ir. No other element has been found to produce negative $\Delta\rho$ of such magnitude at room temperatures.

The negative $\Delta\rho$ effect is produced by the non-magnetic material (Ir) whose presence alters the magnetic properties of the material to which it is added. The exact mechanism for the negative $\Delta\rho$ effect is not presently known. The effect is not dependent upon the Hall resistivity of the material, its thickness, method of preparation, or its other magnetic properties.

FIG. 2.1 shows some examples of Ni—Fe materials exhibiting negative $\Delta\rho$. These are permalloy-type materials having Ir therein in an amount indicated by the horizontal axis. FIG. 2.1 plots the quantity $\Delta\rho/\rho$ against the atomic fraction x of Ir. Two Ni—Fe compositions are indicated in this FIG.

The films used to make the curves shown in FIG. 2.1 were deposited by rf bias sputtering in accordance with the Klokholm and Aboaf paper cited earlier. Another paper by these authors and R. J. Kobliska also describes the production of transition metal ferro-magnetic thin films, and is IEEE Trans. on Magnetics, Vol. Mag-14, No. 5, p. 941, September 1978.

Generally, these films are approximately 5000 Å thick and are prepared on glass or silicon substrates. The negative $\Delta\rho$ effect does not appear to be thickness or substrate dependent, and different thicknesses and substrates can readily be used in the devices of the present invention.

In the case of sputtering or evaporation, the target is generally comprised of two parts. The primary metal (e.g., Fe, Ni, etc.) or an alloy (e.g., Fe—Ni or Co—Ni) forms the base. On top of this base is placed several pieces of the element (Ir) to be added to the film. These substrates generally were rotated on a large plate to allow a more uniform coating of the deposited film thereon. As is apparent in FIG. 2.1, these Ni—Fe alloys exhibit a large negative $\Delta\rho$ effect. An effect of this magnitude has not heretofore been seen at room temperature.

FIG. 2.2 is a plot of $\Delta\rho$ for four different compositions, in a first situation where no Ir is present in the ferromagnetic materials (top curve) and in a second situation where 0.06 atomic fraction of Ir is present in the ferromagnetic materials. The four magnetic compositions were pure Fe, $Fe_{20}Ni_{80}$, $Ni_{70}Co_{30}$, and pure Ni. As is apparent from this FIG., the presence of Ir produces negative $\Delta\rho$ while, in the absence of Ir, positive $\Delta\rho$ is obtained. These are room temperature measurements.

FIG. 2.3 plots $\Delta\rho$ versus atomic fraction x of Ir for the composition $Fe_{1-x}Ir_x$. These measurements were also made at room temperature. These $Fe_{1-x}Ir_x$ compositions produce negative $\Delta\rho$ for Ir up to about 15 atomic percent, after which the material becomes paramagnetic with increased Ir content.

FIG. 2.4 is a plot of $\Delta\rho$ for different atomic fractions x of Ir in a composition comprised of $Ni_{1-x}Ir_x$. The top curve is for measurements at room temperature, while the bottom curve is for measurements made at 77° K.

From this FIG., it is apparent that Ir even in an amount less than 0.025 atomic fraction, will produce negative $\Delta\rho$ in this ferromagnetic material. Above approximately 0.15 atomic fraction, the material loses its magnetism. It should be noted that the curve for data points measured at 77° K. indicates a larger magnitude of $\Delta\rho$ than the room temperature data.

FIG. 2.5 is another plot of $\Delta\rho$ versus atomic fraction x of Ir in the composition $(Ni_{70}Co_{30})_{1-x}Ir_x$. Curves for measurements made at room temperature and at 77° K. are shown in this plot.

As was the situation with the plot of FIG. 2.4, the low temperature data indicates a greater magnitude of negative $\Delta\rho$ than does the room temperature data. Negative $\Delta\rho$ occurs at both room temperature and low temperatures for x greater than about 2.5 atomic percent (x=0.023).

The following table lists many different magnetoresistive compositions which exhibit large negative $\Delta\rho$ at room temperature, and which can be used in devices and circuits having advantages over those employing conventional magnetoresistive materials. Data is shown for both room temperature measurements and low temperature measurements. In measuring the resistivity of these materials, the method of L. J. van der Pauw (cited above) was used. In this table, the thickness t of the films is in angstroms, the magnetization $4\pi M$ is in Gauss, and the resistivity $\rho$ and the anisotropic magnetoresistance $\Delta\rho$ are in microohms-cms. While many different compositions have been mentioned in this table, it should be understood that some of the data represents an average value for many samples having that composition.

TABLE

| Sample | t(Å) | Room Temperature | | | 77° K. | | |
|---|---|---|---|---|---|---|---|
| | | $4\pi M$ | $\rho$ $\mu\Omega cm$ | $\Delta\rho$ $\mu\Omega cm$ | $4\pi M$ Gauss | $\rho$ $\mu\Omega cm$ | $\Delta\rho$ $\mu\Omega cm$ |
| Ni | 3400 | 6180 | 12.14 | +.267 | | 5.25 | .093 |
| $Ni_{.97}Ir_{.03}$ | 3750 | 5350 | 25.00 | −.156 | 5810 | 15.9 | −.204 |
| $Ni_{.942}Ir_{.058}$ | 3900 | 4700 | 30.41 | −.204 | 5145 | 21.0 | −.331 |
| $Ni_{.91}Ir_{.09}$ | 3980 | 3820 para. | 39.3 | −.177 | | 30.4 | −.346 |
| $Ni_{.847}Ir_{.153}$ | 3980 | ~400 | 53.6 | 0 | | 48.5 | −.18 |
| Fe | 1750 | | 56.1 | +.097 | | 31.9 | +.041 |
| $Fe_{.925}Ir_{.075}$ | 3650 | | 63.57 | −.293 | | 44.17 | −.205 |
| $Fe_{.855}Ir_{.145}$ | 3350 | | 71. | −.586 | | 59.7 | −.566 |
| $Fe_{.8}Ir_{.2}$ | 2900 | | 67.1 | 0 | | 35.7 | −.009 |
| $Fe_{.76}Ir_{.24}$ | 3900 | | 66.1 | 0 | | 38.8 | 0 |
| $Fe_{.964}Ir_{.036}$ | | | 26.9 | −.046 | | 13.9 | −.039 |
| $Ni_{82}Fe_{18}$ | | 9180 | 21.23 | +.759 | | | |
| $(Ni_{82}Fe_{18})_{96.6}Ir_{3.4}$ | | 6200 | 75.2 | −.40 | | 71.8 | −.92 |
| $(Ni_{82}Fe_{18})_{94.3}Ir_{5.7}$ | | 8150 | 58.8 | −.52 | | 54.3 | −1.03 |

TABLE-continued

| | | Room Temperature | | | 77° K. | | |
|---|---|---|---|---|---|---|---|
| Sample | t(Å) | $4\pi M$ | $\rho$ $\mu\Omega cm$ | $\Delta\rho$ $\mu\Omega cm$ | $4\pi M$ Gauss | $\rho$ $\mu\Omega cm$ | $\Delta\rho$ $\mu\Omega cm$ |
| $(Ni_{82}Fe_{18})_{91}Ir_{9.0}$ | | 8400 | 47.6 | −.30 | | 40.5 | −.63 |
| $Ni_{79}Fe_{21}$ | | 9600 | 23.14 | +.67 | | | |
| $(Ni_{79}Fe_{21})_{96.6}Ir_{3.4}$ | | 6600 | 78.2 | −.40 | | 74.9 | −.95 |
| $(Ni_{79}Fe_{21})_{94.3}Ir_{5.7}$ | | 7600 | 70.8 | −.62 | | 65.4 | −1.147 |
| $(Ni_{79}Fe_{21})_{91.}Ir_{9.0}$ | | 7200 | 75.8 | −.51 | | 72.3 | −1.09 |
| $Ni_{70}Co_{30}$ | 4200 | | 19.6 | +.906 | 8200 | 12.64 | +1.043 |
| $(Ni_{70}Co_{30})_{96.4}Ir_{3.6}$ | 4200 | | 36.4 | −.070 | 8940 | 30.7 | −.188 |
| $(Ni_{70}Co_{30})_{94.2}Ir_{5.8}$ | 3900 | 8230 | 40.3 | −.410 | 8550 | 35.2 | −.637 |
| $(Ni_{70}Co_{30})_{91.0}Ir_{9.0}$ | 4300 | 7100 | 60.4 | −.572 | 7500 | 55.7 | −1.010 |
| $(Ni_{70}Co_{30})_{98.2}Ir_{1.8}$ | 4250 | 5530 | 20.1 | −.012 | 5990 | 11.1 | −.134 |

Figure 3:
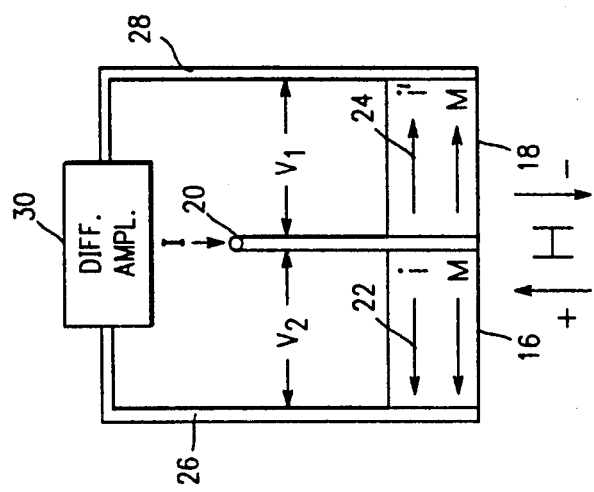
FIG. 3 shows a balanced bridge arrangement using two magnetoresistive elements, one of which has positive $\Delta\rho$ while the other has negative $\Delta\rho$. This bridge arrangement provides improved operation as a magnetic field sensor.

FIGS. 3 and 4

These FIGS. show other representative devices and circuits utilizing the negative $\Delta\rho$ materials of the present invention. FIG. 1 showed a basic sensor in accordance with the present invention.

FIG. 3 shows a balanced bridge arrangement in which two magnetoresistive elements 16 and 18 are utilized. Element 16 is comprised of a conventional magnetoresistive material having positive $\Delta\rho$, while element 18 is comprised of a magnetoresistive material having negative $\Delta\rho$, and is typically one of the materials described hereinabove. An input current I lead 20 provides current i,i' through each of the elements 16 and 18 in the direction of the arrows 22 and 24. The magnitudes of currents i,i' depend on the resistances of elements 16 and 18. Conductor leads 26 and 28 return the current, preferably to a differential amplifier 30.

When elements 16 and 18 are balanced, the voltage $V_1$ is equal to the voltage $V_2$ and the differential output of amplifier 30 is zero. In the magnetoresistive element 16, the direction of the magnetization vector M is parallel to the current through the element, while in element 18 the magnetization vector M is antiparallel to the current direction through that element.

In this circuit arrangement, any rotation of the magnetization vectors M due to a magnetic field +H or −H will cause an opposite change in each of the sensing elements. Thus, the differences between the voltages $V_1$ and $V_2$ will be twice as great because a decrease in resistance will occur in one of the elements 16, 18 and an increase in resistance will occur in the other of the sensing elements. At the same time, any source of noise due to a temperature change would be suppressed since both elements 16 and 18 would go up or down in resistance together and not interfere with the electrical balance of the circuit.

Thus, a circuit is provided in which the presence of a magnetic signal leads to a large unbalancing while the presence of effects, such as noise, do not unbalance the circuit and lead to erroneous readouts.

Each of the magnetoresistive elements 16 and 18 can be biased to put the magnetization M at a 45° angle with the current flow through each sensing element in order to yield a more linear output. The magnetoresistive elements could also be superimposed on each other to reduce the size of the circuit and to provide greater stability from external effects such as temperature-induced noise.

Figure 5:
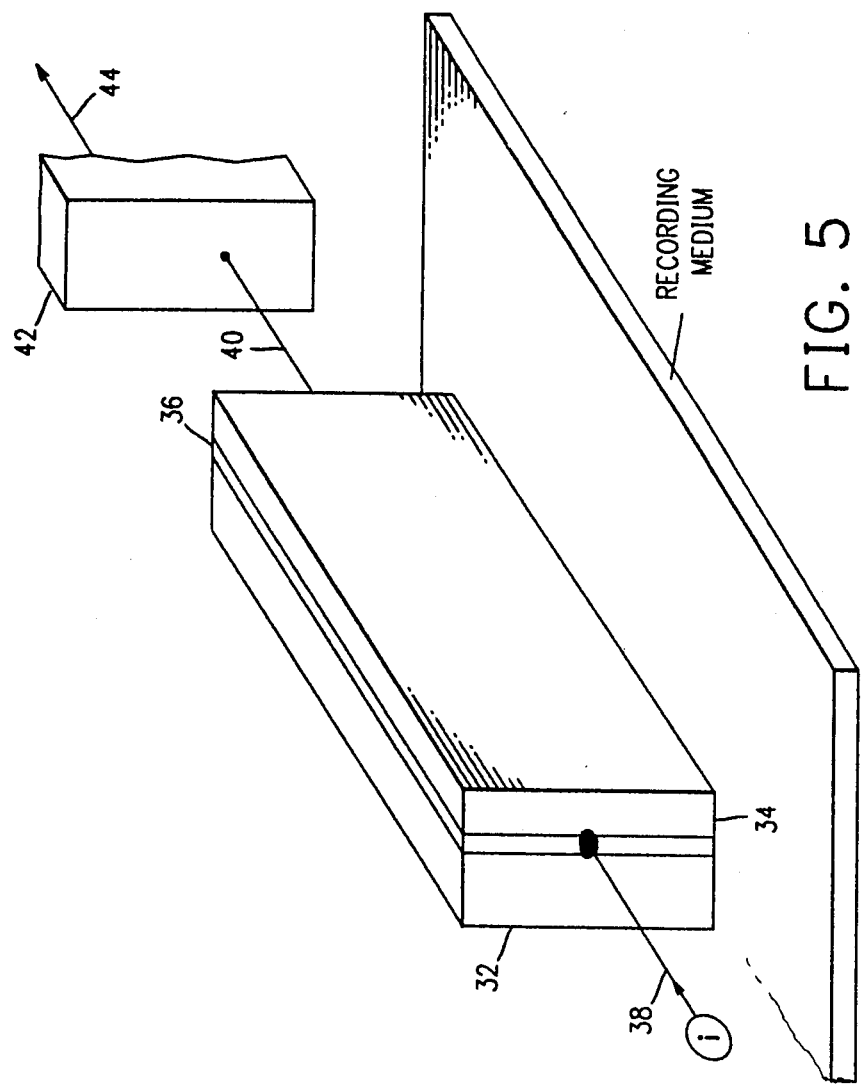
FIG. 5 shows the physical structure and electrical connections of the magnetoresistive elements of FIG. 4, in a read head located in flux-intercepting proximity to a recording medium.

FIGS. 4 and 5 show another circuit in which improved output signals are obtained, while at the same time allowing the coupled elements to be self-biasing (which reduces domain noise). In this circuit, two magnetoresistive elements 32 and 34 are located side by side. These elements are typically separated by a thin layer of an insulating material, such as a 100–200 Å thick layer of $SiO_2$. The sensing elements 32 and 34 are close to one another but are separated by the $SiO_2$ layer in order to prevent domain interaction between the two elements 32 and 34. Element 32 is comprised of a conventional magnetoresistive material exhibiting a positive $\Delta\rho$ effect, while element 34 exhibits a negative $\Delta\rho$ effect. It is comprised of one of the materials described hereinabove, in which Ir causes negative $\Delta\rho$.

FIG. 5 illustrates the physical structure and arrangement of the magnetoresistive elements 32 and 34, as well as the insulating layer 36 ($SiO_2$) between them. A single lead 38 brings current to both of the elements 32 and 34, while lead 40 is taken from elements 32 and 34 to an amplifier 42, usually a differential amplifier, that provides an output on lead 44.

As is apparent from FIG. 4, the elements 32 and 34 self bias one another so that the magnetization vectors M in elements 32 and 34 are at 45° angles with the currents i through the elements. A switching field H can have the direction indicated by arrow 1, while the opposite direction is indicated by arrow 2. Elements 32 and 34 represent two elements of a coupled magnetoresistive read head. Field H can be produced by transitions in a magnetic recording medium located close to the MR elements 32 and 34, such as tapes and disks.

Consider the situation when field H is in direction 1. The magnetization vector M in element 34 will rotate toward the direction 1 making it anti-parallel to the direction of current in that element. In this element, the resistance will decrease (minus $\Delta\rho$). In element 32, a field H in direction 1 will rotate the magnetization vector M into direction 1, which is perpendicular to the direction of current i in that element. Since this is a material with $+\Delta\rho$, a decrease in resistance will occur. The net result is a decrease in resistance in both elements 32 and 34, leading to twice the change in resistance as compared to the use of a single MR element.

When the magnetic transition H is in direction 2, the sensing element 34 switches its magnetization into direction 2, which is transverse to the direction of current through that element. Since this is a $-\Delta\rho$ material, its resistance will increase. The same magnetic transition will rotate the magnetization vector M into direction 2 in element 32, making it parallel to the direction of current through that element. Since this is a $+\Delta\rho$ material, an increase in resistance will occur in this element. The net result is an approximately two-fold increase in resistance as compared with the use of a single magnetoresistive element in a sensing head. Again, this accounts for an approximately double output from the amplifier 42. Of course, a configuration such as that shown in FIGS. 3–5 can have other applications, including those of current and magnetic field sensing devices.

In the arrangement of FIGS. 4, 5, the coupled films 32 and 34 provide a self-biased configuration, so that the magnetization vectors are at ~45° with respect to the current directions in the films. Additionally, an approximately two-fold increase in output is obtained. Such an increased output would not be obtained if two similar films (i.e., if both films had the same sign of $\Delta\rho$) were used in a parallel arrangement.

What is claimed is:

1. A device responsive to a magnetic field including in combination:
    at least one magnetoresistive element exhibiting a negative anisotropic magnetoresistance $\Delta\rho = \rho\|\ -\rho\bot$ at room temperature, said magnetoresistive element being comprised of a material chosen from the group consisting of Ni, Fe, and Co together with Ir, and ferromagnetic alloys and compounds of Ni, Fe, or Co together with Ir, the amount of Ir present being an amount sufficient to cause negative anisotropic magnetoresistance, and
    a source of current through said element, wherein the magnetoresistance of said element changes when said element is intercepted by said magnetic field.

2. The device of claim 1, where the amount of Iridium in said magnetoresistive element is between about 1.5 and about 15 atomic percent.

3. The device of claim 1, further including a magnetoresistive element exhibiting a positive anisotropic magnetoresistance at room temperature.

4. The device of claim 3, in which the same magnetic field will cause opposite effects in each of said magnetoresistive elements in response to external factors such as temperature differences.

5. The device of claim 3, wherein said magnetic field produces changes in said magnetoresistive elements which are cumulative to provide an enhanced output signal.

6. The device of claim 3, wherein said magnetoresistive elements are connected in a bridge circuit.

7. The device of FIG. 3, wherein said magnetoresistive elements are connected to a differential amplifier.

8. The device of claim 1, where said magnetic field is a transition between magnetic domains in a recording medium.

9. A device including a magnetoresistive element responsive to a magnetic field, said device including
    at least one magnetoresistive element having current flow therethrough, the room temperature resistivity of said element when the magnetization M of said element is perpendicular to the direction of current therethrough being greater than the room temperature resistivity of said element when its magnetization M is parallel to the direction of current flow therethrough,
    said magnetoresistive element having negative anisotropic magnetoresistance and being comprised of a material selected from the group consisting of Ni, Fe, and Co together with Ir, the amount of Ir present being an amount sufficient to cause negative anisotropic magnetoresistance,
    means for establishing a current flow through said element, and
    means for providing said magnetic field acting upon said magnetoresistive element.

10. The device of claim 9, where said magnetoresistive element is biased to have its magnetization at an angle with the direction of current through said element, said angle being greater than 0° and less than 90°.

11. The device of claim 9, wherein said magnetoresistive element is biased to have a substantially linear response to said magnetic field.

12. The device of claim 9, further including at least one additional magnetoresistive element, wherein said additional magnetoresistive element exhibits a positive $\Delta\rho$ effect.

13. The device of claim 12, wherein said magnetoresistive elements are arranged electrically in parallel.

14. The device of claim 12, where said magnetoresistive elements are located close to one another.

15. The device of claim 12, where said magnetoresistive elements are connected to an amplifier.

16. The device of claim 15, where said magnetoresistive elements bias one another.

17. The device of claim 12, where said magnetic field is produced by a recording medium.

* * * * *